(12) United States Patent
Okandan et al.

(10) Patent No.: US 10,304,977 B1
(45) Date of Patent: May 28, 2019

(54) HIGH PERFORMANCE ULTRA-THIN SOLAR CELL STRUCTURES

(71) Applicant: National Technology & Engineering Solutions of Sandia, LLC, Albuquerque, NM (US)

(72) Inventors: Murat Okandan, Edgewood, NM (US); Gregory N. Nielson, Albuquerque, NM (US); Jose Luis Cruz-Campa, Albuquerque, NM (US); Paul J. Resnick, Albuquerque, NM (US); Carlos Anthony Sanchez, Belen, NM (US)

(73) Assignee: National Technology & Engineering Solutions of Sandia, LLC, Albuquerque, NM (US)

( * ) Notice: Subject to any disclaimer, the term of this patent is extended or adjusted under 35 U.S.C. 154(b) by 217 days.

(21) Appl. No.: 14/709,284

(22) Filed: May 11, 2015

Related U.S. Application Data

(62) Division of application No. 13/626,994, filed on Sep. 26, 2012, now abandoned.

(51) Int. Cl.
| | |
|---|---|
| *H01L 31/068* | (2012.01) |
| *H01L 31/18* | (2006.01) |
| *H01L 31/054* | (2014.01) |
| *H01L 31/056* | (2014.01) |
| *H01L 31/0216* | (2014.01) |
| *H01L 31/0232* | (2014.01) |

(52) U.S. Cl.
CPC .. *H01L 31/02327* (2013.01); *H01L 31/02167* (2013.01); *H01L 31/02168* (2013.01);
(Continued)

(58) Field of Classification Search
CPC ....... H01L 31/02245; H01L 31/022458; H01L 31/1876; H01L 31/1892; H01L 31/1896; H01L 31/188; H01L 31/0516; H01L 25/042; H01L 27/142; H01L 2221/68304; H01L 31/0475; H01L 31/0682;
(Continued)

(56) References Cited

U.S. PATENT DOCUMENTS

| | | | | |
|---|---|---|---|---|
| 5,665,607 A | * | 9/1997 | Kawama | ......... H01L 31/022425 136/256 |
| 6,500,731 B1 | * | 12/2002 | Nakagawa | .......... H01L 21/6835 257/E21.57 |

(Continued)

FOREIGN PATENT DOCUMENTS

| | | | |
|---|---|---|---|
| WO | WO 2010124078 A2 | * 10/2010 | ........... H01L 31/042 |
| WO | WO2011105907 A1 | 9/2011 | |

*Primary Examiner* — Andrew J Golden
(74) *Attorney, Agent, or Firm* — Martin I. Finston; Mark A. Dodd

(57) ABSTRACT

A method, system and apparatus including a device cell having a top side, a bottom side and opposing side walls. A passivation layer is formed along the top side, the bottom side and opposing side walls of the device cell. The passivation layer serves to passivate the device cell and facilitate carrier collection around the device cell. An anti-reflective layer is formed over the passivation layer and an optical layer is formed on the top side of the device cell. The optical layer reflects light within the device cell. The apparatus may further include a reflective layer formed along the bottom side of the device cell, the reflective layer to reflect light internally within the device cell.

17 Claims, 10 Drawing Sheets

(52) U.S. Cl.
CPC .......... *H01L 31/054* (2014.12); *H01L 31/056* (2014.12); *H01L 31/1804* (2013.01); *H01L 31/0682* (2013.01); *H01L 31/1892* (2013.01)

(58) Field of Classification Search
CPC ......... H01L 31/0463; H01L 31/022441; H01L 31/1804; H01L 31/1868; H01L 21/6835; H01L 31/02327; H01L 31/02167; H01L 31/02168; H01L 31/054; H01L 31/056
USPC .................................................. 136/243–265
See application file for complete search history.

(56) References Cited

U.S. PATENT DOCUMENTS

| | | | |
|---|---|---|---|
| 6,534,336 B1 * | 3/2003 | Iwane | H01L 31/0236 257/E31.13 |
| 8,329,503 B1 * | 12/2012 | Nielson | H01L 31/0543 257/E27.125 |
| 2004/0200520 A1 | 10/2004 | Mulligan et al. | |
| 2009/0008787 A1 * | 1/2009 | Wenham | H01L 31/022425 257/773 |
| 2009/0194162 A1 * | 8/2009 | Sivaram | H01L 31/1892 136/258 |
| 2010/0032010 A1 * | 2/2010 | Herner | H01L 31/0392 136/256 |
| 2010/0084009 A1 | 4/2010 | Carlson et al. | |
| 2010/0200065 A1 | 8/2010 | Choi | |
| 2010/0229928 A1 * | 9/2010 | Zuniga | H01L 31/1892 136/255 |
| 2010/0233838 A1 * | 9/2010 | Varghese | H01L 31/1896 438/64 |
| 2011/0005582 A1 * | 1/2011 | Szlufcik | H01L 31/02245 136/252 |

* cited by examiner

HIGH PERFORMANCE ULTRA-THIN SOLAR CELL STRUCTURES

CROSS-REFERENCE TO RELATED APPLICATION

This application is a divisional of and claims priority to U.S. Non-Provisional patent application Ser. No. 13/626,994 filed on Sep. 26, 2012 under the title "High Performance Ultra-Thin Solar Cell Structures", the entirety of which is incorporated herein by reference.

GOVERNMENT RIGHTS

This invention was made with Government support under Contract No. DE-AC04-94AL85000 awarded by the U.S. Department of Energy. The Government has certain rights in the invention.

FIELD OF THE INVENTION

The present invention relates in general to a process and structure for an ultra-thin, high efficiency device, representatively, an ultra-thin, high efficiency solar cell. Other embodiments are also described and claimed.

BACKGROUND

The adoption of photovoltaics for generating electricity from sunlight is largely driven by cost considerations. At present, photovoltaic systems are not competitive with fossil-fuel generated electricity. Thus, there is a need to reduce the overall photovoltaic system cost. This entails reducing the costs associated with photovoltaic solar cell fabrication.

One way to reduce costs is to reduce the size of the photovoltaic solar cells. In this aspect, small and thin photovoltaic cells have been developed that reduce photovoltaic material use dramatically. These thin photovoltaic cells are typically formed on top of a handle wafer. Once formed, the cells may be individually detached from the handle wafer by, for example, an etching process using a hydrofluoric acid (HF) solution to undercut the cells. These "free floating" cells may then be assembled into sheets by attracting the individual cells to a desired position on a sheet of material using self-assembly techniques. Finally, the cells may be embedded in a low-cost substrate with contacts and microlenses to form photovoltaic sheets.

Although reducing the size of the solar cells helps to reduce costs, it may also reduce cell efficiency. Various cell configurations have therefore been developed in an effort to improve efficiency. For example, emitter wrap-through (EWT) cells are high-efficiency back-contact solar cells that include vias that allow an emitter on the front of the cell to be "wrapped-through" to the back surface. This type of cell can be fabricated with lower quality and thinner silicon without significant losses in efficiency. Another type of photovoltaic cell designed to improve efficiency is known as the point-contact-cell. The point-contact-cell has alternating n and p regions that form a polkadot array on the bottom surface and metallization to provide electrical contacts on the bottom surface. Such devices, however, only offer a limited set of possible improvements in cell efficiency.

SUMMARY

A method, apparatus and system for ultra-thin, high efficiency solar cell fabrication is disclosed. The method utilizes integrated circuit (IC) and microfabrication processing techniques thereby minimizing the amount of semiconductor material (e.g., silicon) needed to generate power. Ultimate cell efficiency is achieved by passivation of all cell surfaces while enabling carrier collection through doped regions across all surfaces. In addition, structures formed on the front and back surfaces allow for multiple (total) internal reflection and absorption of photons that enter the cell.

Representatively, according to one embodiment, the apparatus includes a device having a top side, a bottom side and opposing side walls. A passivation layer (which could be a "surface field" formed by doping the surface of the material with n or p-type dopants) is formed along the top side, the bottom side and opposing side walls of the device. The passivation layer serves to passivate the device and facilitate carrier collection around the device. An anti-reflective layer is formed over the passivation layer and further surrounds the device. A diffraction layer is formed on the top side of the device. The diffraction layer serves to diffract light entering the device. A reflective layer can also be formed along the bottom side of the device. The reflective layer reflects the diffracted light internally within the device.

In one embodiment, a method includes forming a diffraction layer along a top side of a device layer, the diffraction layer capable of diffracting light entering the device layer. The device layer is bonded to a handle wafer such that the diffraction layer is facing the handle wafer. Trenches are formed within the device layer to define devices having side walls extending between the top side and a bottom side of the device layer. A dopant is applied to the bottom side and sidewalls of each of the devices to form a passivation layer around each of the devices. An anti-reflective layer is formed over the passivation layer and a reflective layer is formed on the bottom side of each of the devices. The reflective layer is capable of reflecting the diffracted light internally within the devices.

In one embodiment, a system includes a solar cell having a top side, a bottom side and opposing side walls, and implant regions formed along the bottom side of the solar cell. A passivation layer is formed around the top side, the bottom side and opposing side walls to passivate the solar cell and facilitate carrier collection around the solar cell. An anti-reflective layer is formed around the top side, the bottom side and opposing side walls of the solar cell and a plurality of reflective structures are formed over the implant regions on the bottom side of the device. The reflective structures reflect light internally within the device.

The above summary does not include an exhaustive list of all aspects of the present invention. It is contemplated that the invention includes all systems and methods that can be practiced from all suitable combinations of the various aspects summarized above, as well as those disclosed in the Detailed Description below and particularly pointed out in the claims filed with the application. Such combinations have particular advantages not specifically recited in the above summary.

BRIEF DESCRIPTION OF THE DRAWINGS

The embodiments of the invention are illustrated by way of example and not by way of limitation in the figures of the accompanying drawings in which like references indicate similar elements. It should be noted that references to "an" or "one" embodiment of the invention in this disclosure are not necessarily to the same embodiment, and they mean at least one.

DETAILED DESCRIPTION

In this section we shall explain several preferred embodiments of this invention with reference to the appended drawings. Whenever the shapes, relative positions and other aspects of the parts described in the embodiments are not clearly defined, the scope of the invention is not limited only to the parts shown, which are meant merely for the purpose of illustration. Also, while numerous details are set forth, it is understood that some embodiments of the invention may be practiced without these details. In other instances, well-known structures and techniques have not been shown in detail so as not to obscure the understanding of this description.

Figure 1:
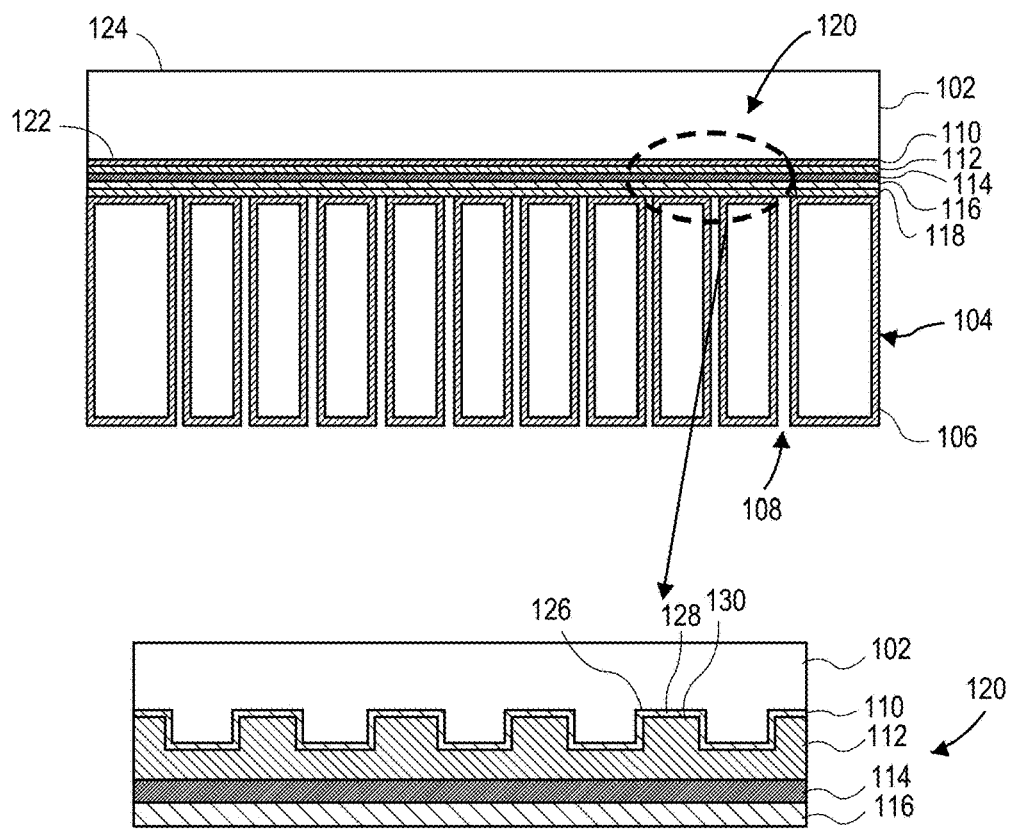
FIG. 1 schematically illustrates a cross-sectional view of one embodiment of a device layer attached to a handle wafer.

FIG. 1 schematically illustrates a cross-sectional view of one embodiment of a device layer attached to a handle wafer. Device layer 102 may include a top side 122 and a bottom side 124. Side 122 is referred to as the top side because once the final device cell is formed, this is the side, in the case of a photovoltaic or solar cell device, that faces and receives energy from the light source. Device layer 102 may be made of any semiconductor material suitable for forming devices therefrom. Representatively, device layer 102 may be made of a silicon material or other types of semiconductor materials including, but not limited to, germanium and III-V compound semiconductors (e.g. gallium arsenide, indium phosphide, indium gallium arsenide, etc.). Devices that may be made from device layer 102 may include, but are not limited to, detectors, sensors, photovoltaic (PV) cells, integrated circuits (IC), micro-machine parts, micro-mechanical parts, electronic components, a combination of any of the above, or other devices specific for a desired use.

Device layer 102 may be ultra-thin, e.g. from about 1 to about 50 microns (μm), such that a device formed from device layer 102 is also ultra-thin. Typically, processing of such thin devices is challenging with standard IC and microsystem fabrication techniques in terms of handling, induced stresses and breakage of the device layer during the processing. Device layer 102 may therefore be attached to handle wafer 104. Handle wafer 104 effectively increases the thickness of device layer 102 to a thickness suitable for use with conventional IC and microsystem fabrication techniques. In one embodiment, device layer 102 is attached to handle wafer 104 such that its top side 122 is facing handle wafer 104.

Returning to the structure of handle wafer 104, in one embodiment, handle wafer 104 is a structured wafer that includes multiple through holes (e.g., holes 108) (not drawn to scale) that form a pattern through handle wafer 104. Each of holes 108 extends vertically through the thickness of handle wafer 104. In one embodiment, holes 108 can be formed with uniform spacing among them, with non-uniform spacing among them, or at random locations. Holes 108 can be of the same size or different sizes (e.g., a diameter in the range of 50-500 microns (μm)). In one embodiment, handle wafer 104 is made of silicon or any silicon-based materials. It is appreciated that handle wafer 104 can be single crystalline or polycrystalline silicon. In alternative embodiments, handle wafer 104 can be made of other materials such as ceramic materials. It is appreciated that the shape and dimensions of handle wafer 104 will be dictated, in one embodiment, by the requirements of device layer 102 adhered thereto.

Handle wafer 104 can be manufactured with standard semiconductor processing techniques. In one embodiment, handle wafer 104 can be formed from a base wafer (e.g., a silicon wafer) with a hard mask deposited thereon. An example of the hard mask is an oxide layer that is patterned to define the size(s) and locations of holes 108. The hard mask exposes the part of the silicon wafer where holes 108 are to be formed. An etching method can then be used to etch through the silicon wafer to form holes 108. The hard mask is removed after holes 108 are formed.

A dielectric layer 106 (e.g., an oxide layer and/or a nitride layer) can be formed on the entire exposed surface (including the inner surfaces of holes 108 (i.e., the surface that defines the passage or lumen)) of handle wafer 104, as shown in FIG. 1. In one embodiment, dielectric layer 106 is a thin layer of silicon dioxide with a thickness in the range of 1000 Angstroms-1 micron. It is noted that handle wafer 104 is formed prior to application of device layer 102. Still further, although a structured handle wafer 104 is described and illustrated it is contemplated that handle wafer 104 may be any standard, non-structured wafer suitable for processing of a device and any associated components as described herein.

Various layers are formed between device layer 102 and handle wafer 104. Representatively, in one embodiment, device layer 102 includes a passivation layer 110 formed along top side 122. In one embodiment, passivation layer 110 may be a p-type or n-type doped region formed by an implantation or diffusion process, also referred to as surface field passivation. It is also possible and sometimes desirable to form this doped layer during the epitaxy process that forms the device layer. This allows low dopant concentrations not possible by diffusion or implantation to be achieved. Suitable dopants for the p-type doped region may include, but are not limited to, boron or gallium as the dopant. Suitable dopants for the n-type doped region may include, but are not limited to, phosphorus and arsenic. Passivation layer 110 provides passivation to device layer 102. For example, passivation layer 110 can reduce surface recombination, which is a significant loss mechanism in solar cells. In addition, the passivation layer 110 can serve as a pathway for carriers within device layer 102 if it is formed as surface field passivation layer created by doping the surface of the semiconductor forming the cell. By providing an additional carrier collection pathway in the surface field passivating layer, the carrier collection can be enhanced which results in improved efficiency of the cell. In this aspect, passivation layer 110 may be formed around the entire device cell that is formed from device layer 102 as will be described in more detail below.

A dielectric layer 112 and anti-reflective layer 114 may further be formed between device layer 102 and handle wafer 104. Dielectric layer 112 may be formed over passivation layer 110. Dielectric layer 112 may serve as a further passivation or protection layer to protect device layer 102 during the etching steps used, for example, to remove device layer 102 from handle wafer 104. Dielectric layer 112 may therefore be any type of material suitable for serving at least these purposes. Representatively, in one embodiment, dielectric layer 112 may be made of silicon nitride or silicon oxide. In one embodiment, dielectric layer 112 may be a relatively thin layer such that it does not substantially affect the passage of light through a device cell formed from device layer 102. For example, dielectric layer 112 may have a thickness of from about 0.01 µm to about 1 µm. Dielectric layer 112 may be formed by any conventional processing technique, for example, a chemical vapor deposition process.

Anti-reflective layer 114 may be formed over dielectric layer 112. Anti-reflective layer 114 helps to reduce light reflection away from the device cell that is formed from device layer 102. This is important because, in embodiments where the device cell has optoelectronic properties, for example, a solar cell, it is desirable for light contacting the solar cell to enter the device and not be reflected away. Anti-reflective layer 114 may be made of any material that is transparent to the wavelength of light of interest. The thickness and index of the anti-reflection layer are selected to use optical interference effects to force light into the cell rather than be reflected by it. The anti-reflection film may be comprised of either a single material or multiple layers. Silicon nitride is a commonly used anti-reflection material for silicon solar cells. The anti-reflection layers can be deposited by a variety of means such as sputtering, atomic layer deposition, electron beam evaporation, chemical vapor deposition, and others.

Release layer 116 may further be formed between device layer 102 and handle wafer 104 to facilitate removal of device layer 102 from handle wafer 104. Release layer 116 may be made of any material capable of being removed by an etchant that will not etch or damage the final device cell. In addition, the material for release layer 116 is selected so as to allow release of device layer 102 from handle wafer 104 with multiple sources for the device layer. In other words, the release layer can be selected to allow release of the device layer from the handle wafer whether the device layer is produced using standard wafer manufacturing techniques (i.e., polysilicon growth and wafer pull/ingot casting, followed by wiresaw and grinding/polishing), or more advanced wafering techniques such as ion implantation to create thin initial wafers, or directly growing the device layer using epitaxy or another deposition method (which would result in very low energy input into the creation of the device layer). Representatively, in one embodiment, release layer 116 may be made of aluminum indium phosphide (AlInP) and, during a later step, etched using hydrochloric acid (HCl). Alternatively, release layer 116 may be made of silicon (Si) and removed with xenon difluoride (XeF$_2$). In still further embodiments, release layer 116 can be made of amorphous-Si or spin-on glass. Release layer 116 may have a thickness of from about 0.05 µm to about 1 µm. Release layer 116 may be formed by any conventional processing technique, for example, a chemical vapor deposition process.

Finally, bonding layer 118 may be formed between device layer 102 and handle wafer 104 to facilitate attachment of the structures together. Bonding layer 118 may be formed on handle wafer 104 such that the device layer 102 and handle wafer 104 are attached together by placing release layer 116 and bonding layer 118 in contact with one another. Bonding layer 118 may be made of any material capable of bonding to release layer 116. Representatively, bonding layer 118 may be made of an oxide material, for example, silicon oxide; silicon nitride; or other semiconductor, dielectric, metal, or organic layer. Bonding layer 118 may have a thickness of from about 0.01 µm to about 1 µm. Bonding layer 118 may be formed by any conventional processing technique, for example, a chemical vapor deposition process.

Prior to attaching device layer 102 to handle wafer 104, top side 122 may be texturized to form an optical layer 120 between device layer 102 and handle wafer 104. The optical layer 120 serves to enhance optoelectronic properties of the cell device formed from device layer 102. For example, optical layer 120 may modify the angle of the light within the cell to enhance total internal reflection and therefore increase light trapping. Various embodiments of the optical layer 120 are illustrated in the magnified views provided in FIGS. 1-3. These figures indicate one embodiment of the optical layer where the structure is a diffraction structure. Other optical layers are possible including random texturing, periodic pyramid structures, plasmonic devices, etc. It is noted that, for ease of illustration, the optical layer 120 is only illustrated in the magnified views of FIGS. 1-3. It is to be understood, however, that although it is not illustrated in each of the figures, optical layer 120 is included along the top side of device layer 102 and the resulting device cells throughout the figures.

Representatively, in one embodiment illustrated in FIG. 1, top side 122 is texturized to include a number of surface channels (e.g., channels 126) (not drawn to scale) that form a pattern on the top surface of device layer 102. Each channel 126 lies across the top surface of device layer 102 and may extend lengthwise. In one embodiment, each channel 126 extends lengthwise from one side surface (i.e., an edge) to the opposite side surface (i.e., the opposite edge) of device layer 102. In an alternative embodiment, each channel 126 extends lengthwise on the top surface but the extension stops before reaching an edge of device layer 102. In yet another embodiment, some of channels 126 may extend from edge to edge and some of channels do not extend from edge to edge. In one embodiment, channels 126 can be formed with uniform spacing among them, with non-uniform spacing among them, or at random locations. Channels 126 can be of the same size or different sizes (e.g., a width in the range of about 1000 Angstroms (Å) to about 10 microns and a depth in the range of 1000 Å-10 microns) with the optimal size determined by the range of wavelengths of light the channels are intended to interact with and bonding process step and release process step requirements such as fluid (hydrogen, $XeF_2$, HF) flow through the channels and fluid wetting of the channels. In this aspect, in addition to forming an optical layer 120 which can enhance optoelectronic properties of devices formed from device layer 120, channels 126 can provide pathways for etchants to reach release layer 116. As a result, the release process can be accelerated.

Optical layer 120 can be manufactured with standard semiconductor processing techniques. In one embodiment, channels 126, which make up a diffraction implementation of the optical layer 120, can be formed by depositing a hard mask or photoresist layer on the top surface of device layer 102. An example of the hard mask or photoresist layer is an oxide layer that is patterned to define the size(s) and locations of channels 126. The hard mask exposes the part of device layer 102 where channels 126 are to be formed. An etching method can then be used to etch device layer 102 to form channels 126 with a specific depth. The hard mask is removed after channels 126 are formed.

Passivation layer 110 is then formed on the entire exposed surface (including the inner surfaces of channels 126) of device layer 102 followed by dielectric layer 112. The passivation layer 110 could be comprised of dielectric materials, semiconductor materials, or as previously discussed, it may be formed by an ion implantation, diffusion or epitaxy process. In a particular embodiment, passivation layer 110 is an implantation layer formed around the edges of channels 126 and will include ridges 128 which conform to a shape of channels 126. Dielectric layer 112 is further applied such that it fills channels 126 and includes corresponding channels 130, which coincide with channels 126 formed by device layer 102. The exposed surface of dielectric layer 112 can then be optionally planarized so that the exposed surface is substantially flat. The remaining anti-reflective layer 114 and release layer 116 can then be applied over dielectric layer 112 as illustrated in FIG. 1. In some embodiments some of these layers may be combined in such as way that the functionality is provided by a single layer. For example, the passivation layer 110 and the dielectric layer 112 could be formed from the same material and be effectively the same layer. Another example could be the combination of the dielectric layer 112 and the anti-reflection layer 114 such that they are made from the same material but both functions are provided by the single material layer.

Figure 2:
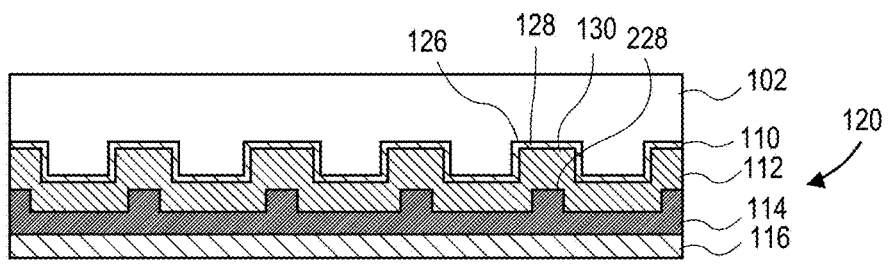
FIG. 2 schematically illustrates a magnified view of a diffraction layer formed on the device layer of FIG. 1.

Alternatively, as illustrated in FIG. 2, the planarization step may be omitted, such that channels 130 remain within dielectric layer 112. Anti-reflective layer 114 therefore fills channels 130 of dielectric layer 112. This in turn causes channels 228 to form in anti-reflective layer 114. Channels 228 coincide with channels 126 of device layer 102 and channels 130 of dielectric layer 112. The exposed surface of anti-reflective layer 114 may be planarized (optional) such that release layer 116 forms a substantially planar layer on top of anti-reflective layer 114.

Figure 3:
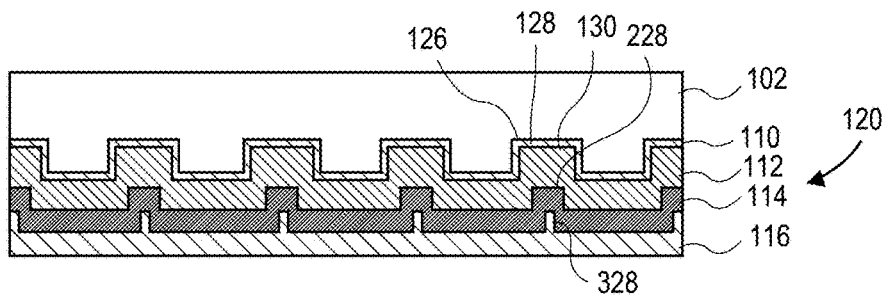
FIG. 3 schematically illustrates a cross-sectional view of a diffraction layer formed on the device layer of FIG. 1.

In another embodiment, as illustrated in FIG. 3, anti-reflective layer 114 is not planarized. When release layer 116 is applied, it fills channels 228 of anti-reflective layer 114 and forms channels 328. The exposed surface of release layer 116 can then be planarized so that a smooth contact can be made between release layer 116 and bonding layer 118 of handle wafer 104. Thus, as can be seen from FIGS. 1-3, optical layer 120 is formed by the top surface of device cell 120 and one or more of passivation layer 110, dielectric layer 112, anti-reflective layer 116 and release layer 116 having channels. The channels, 126, 130, 228 and/or 328 form a grating which can be used to diffract photons entering top side 122 of device cells formed from device layer 102. Diffraction of the entering photons helps to disperse them internally throughout the device cell, which in turn enhances photon absorption.

Figure 4:
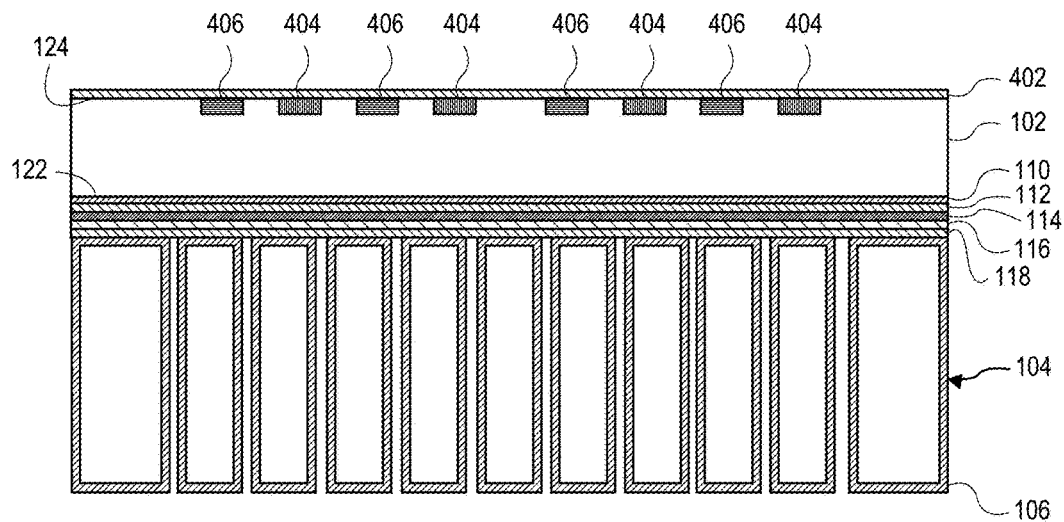
FIG. 4 schematically illustrates a cross-sectional view of one embodiment of implant regions formed in a device layer.

FIG. 4 schematically illustrates a cross-sectional view of one embodiment of a screen oxide layer formed on a device layer attached to a handle wafer. Screen oxide layer 402 may be formed along the bottom side 124 of device layer 102. Screen oxide layer 402 may be formed by thermally growing the oxide layer (e.g., $SiO_2$) on device layer 102 according to conventional techniques. In some embodiments, screen oxide layer 402 may have a thickness of from about 0.01 µm to about 0.1 µm. The screen oxide layer is used to minimize surface damage in the semiconductor device layer during ion implantation of the n and p dopants used to create the junction in the solar cell. The screen oxide layer can be left in place for additional protection and passivation of the cell but can also be removed followed by regrowth of a new thermal oxide for passivation.

Next, implant regions 404 and implant regions 406 may be formed within the bottom side 124 of device layer 102 through screen oxide layer 402. Implant regions 404, 406 may be semiconductor junctions which are n-type-doped or p-type-doped regions formed with a p-type or n-type impurity dopant. One or more of implant regions 404 and implant regions 406 may have opposite dopant types.

Representatively, implant regions 404 may be a p-type implant region (e.g., boron or gallium) and implant regions 406 may be an n-type implant region (e.g., phosphorus or arsenic). Implant regions 404 and implant regions 406 may be formed according to any suitable semiconductor processing technique. For example, a photoresist layer may be applied over screen oxide layer 402. The photoresist layer may be patterned to include openings over regions of device layer 102 where it is desired to form implant regions 404. A p+ implant may then be applied to form each of implant regions 404. The photoresist layer may be removed and a second photoresist layer applied and patterned to include openings over regions where implant regions 406 is to be formed. An n+ implant is then applied to form each of implant regions 406. The second resist is then removed. Other non-implant based approaches to creating the n and p doped regions in the cell are also possible. For example, diffusion techniques can be used such as spin-on-glass material loaded with dopants can be used to diffuse in doped regions or a solid source dopant diffusion process can be used.

Figure 5:
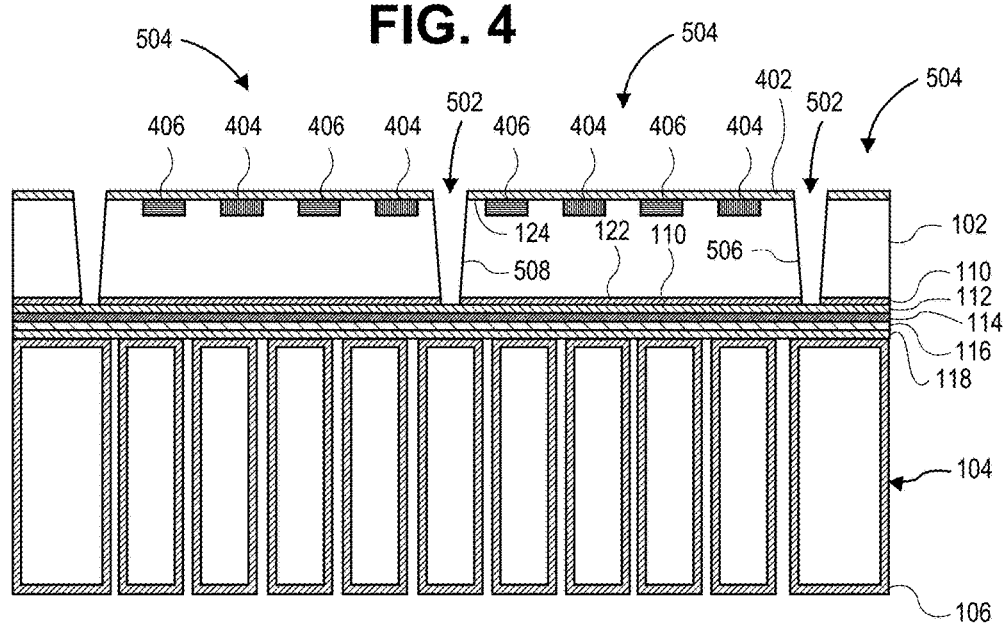
FIG. 5 schematically illustrates a cross-sectional view of one embodiment of device cells formed from a device layer.

Next, trenches 502 may be formed through device layer 102 to create a plurality of device cells 504 as illustrated in FIG. 5. Trenches 502 may be formed using a mask or photoresist layer as previously discussed. Representatively, a photoresist layer may be applied over screen oxide layer 402 and patterned to include openings at regions where trenches 502 are to be formed. An etch method suitable for etching device layer 102 (e.g., Reactive Ion Etching (RIE) or Deep Reactive Ion Etching (DRIE)) is then applied. The etch step may further etch through passivation layer 110 and stop at dielectric layer 112. The resulting trenches 502 may form sloped side walls 506, 508 between the top side 122 and bottom side 124 of each device cell 504. It is noted that each device cell 504 includes substantially the same features. As such, a description of one device cell 504 applies to any other device cell 504 and some of the features of the cells may be omitted throughout the figures for ease of illustration.

Figure 6:
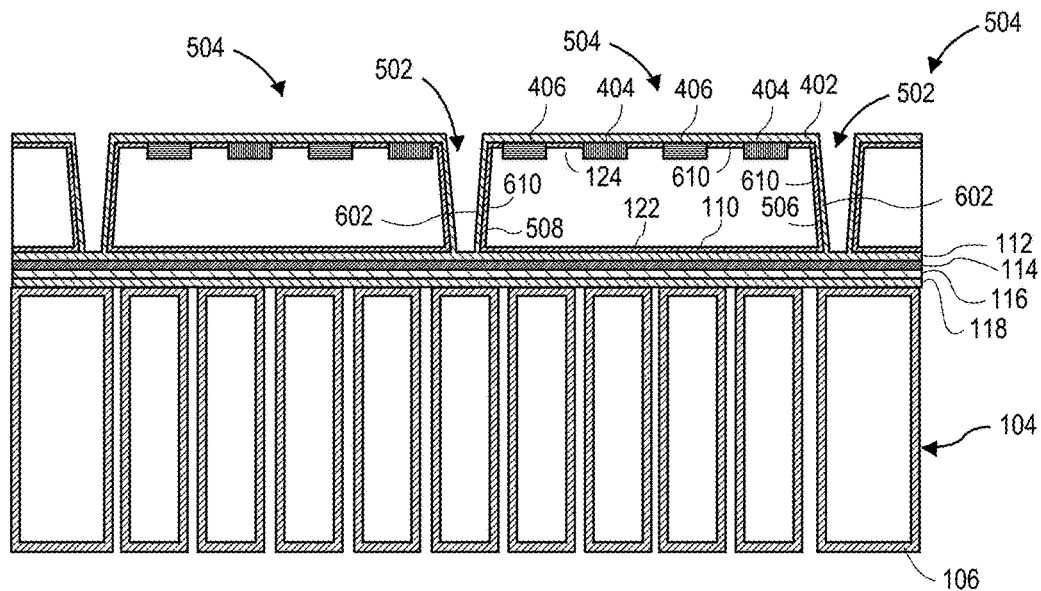
FIG. 6 schematically illustrates a cross-sectional view of one embodiment of a thermal oxide layer formed around device cells.

Once side walls 506, 508 are formed a thermally grown oxide layer 602 can be formed alongside walls 506, 508 as illustrated in FIG. 6. This thermal oxide layer in conjunction with thermal oxide layer 402 can be used as screen oxide layers to implant a surface field passivation layer 610 alongside walls 506, 508 and bottom side 124 of each device cell 504. In this aspect, each device cell 504 is entirely encased within passivation layers 110, 610 and oxide and/or dielectric layers 402, 602, and 112. It is noted that in one embodiment, passivation layers 110, 610 are lightly doped regions (e.g., p– or n–) capable of providing surface field passivation. Screen oxide layer 602 and passivation layer 610 can be formed according to the techniques previously discussed. It is noted that the slope of side walls 506, 508 facilitates implantation of dopants (e.g., p-type or n-type) along the side walls. Alternatively, in embodiments where side walls 506, 508 are not sloped, the dopants may be implanted at angles or diffused into the side walls so that a desired thickness of passivation layer 610 is formed on the side walls.

Figure 7:
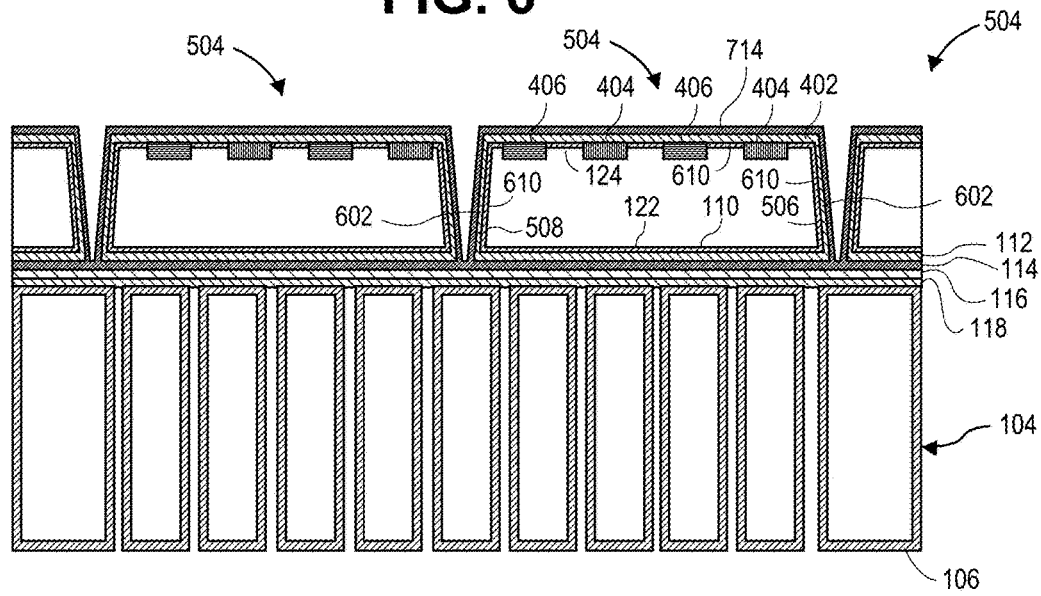
FIG. 7 schematically illustrates a cross-sectional view of one embodiment of an anti-reflective layer formed around device cells.

As illustrated in FIG. 7, a further anti-reflective layer 714 may be applied over bottom side 124 and side walls 506, 508 of each device cell 504 such that the entire device cell is also surrounded by anti-reflective layer 714 and anti-reflective layer 114 which was previously formed along top side 122. Encapsulating device cell 504 within anti-reflective layers 114, 714 enhances the light absorption capabilities of cell 504 in that it diminishes light reflection away from cell 504. Anti-reflective layer 714 may be, for example, a nitride layer having a thickness of from about 0.05 µm to about 0.3 µm. A nitride layer also provides hermeticity to the cell, preventing diffusion of impurities into the active device, further improving reliability and lifetime of the device and the resulting system. A variety of other materials and mechanisms can be used as anti-reflection coatings, including a variety of transparent dielectric materials such as alumina, magnesium fluoride, diamond-like carbon, etc., as well as other more exotic methods such as nanostructured films, self-assembled microspheres, and organic materials.

It is noted that prior to application of anti-reflective layer 714, portions of screen oxide layer 602 covering side walls 506, 508 may optionally be removed according to any conventional technique (e.g., etching). Removal and regrowth of oxide layer 602 on side walls 506, 508 may help to improve device performance. Such step, however, is not required.

Figure 8:
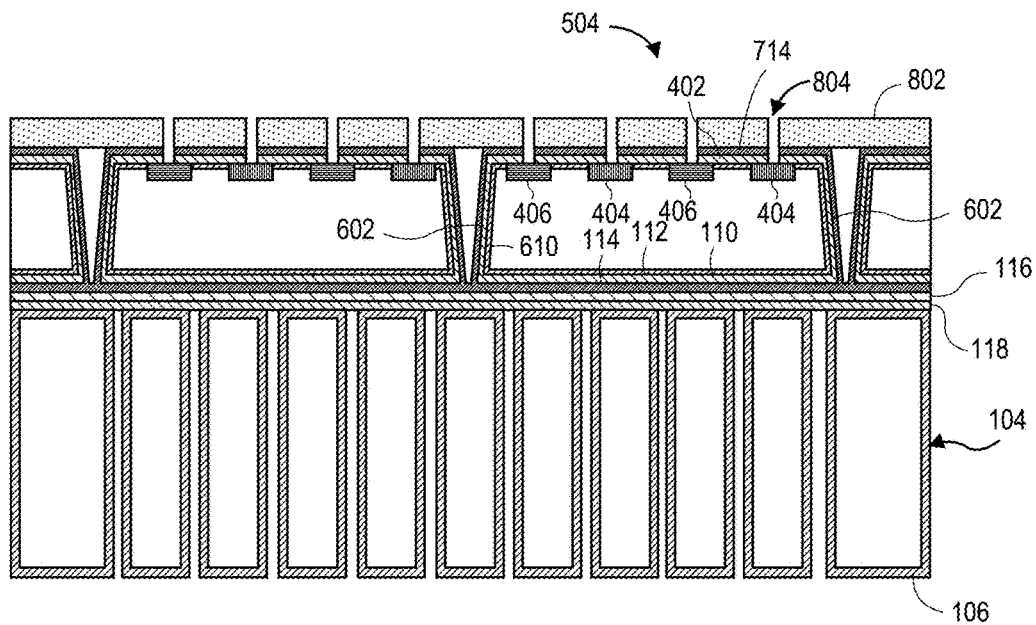
FIG. 8 schematically illustrates a cross-sectional view of one embodiment of contact holes formed over implant regions of device cells.

As illustrated in FIG. 8, once anti-reflective layer 714 is applied, a further photoresist layer 802 may be formed over bottom side 124 of device cells 504 and patterned to define contact holes 804. Contact holes 804 may be aligned with implant regions 404, 406. An etch method may then be applied through contact holes 804 to etch through anti-reflective layer 714 and oxide layer 402 down to implant regions 404, 406.

Figure 9:
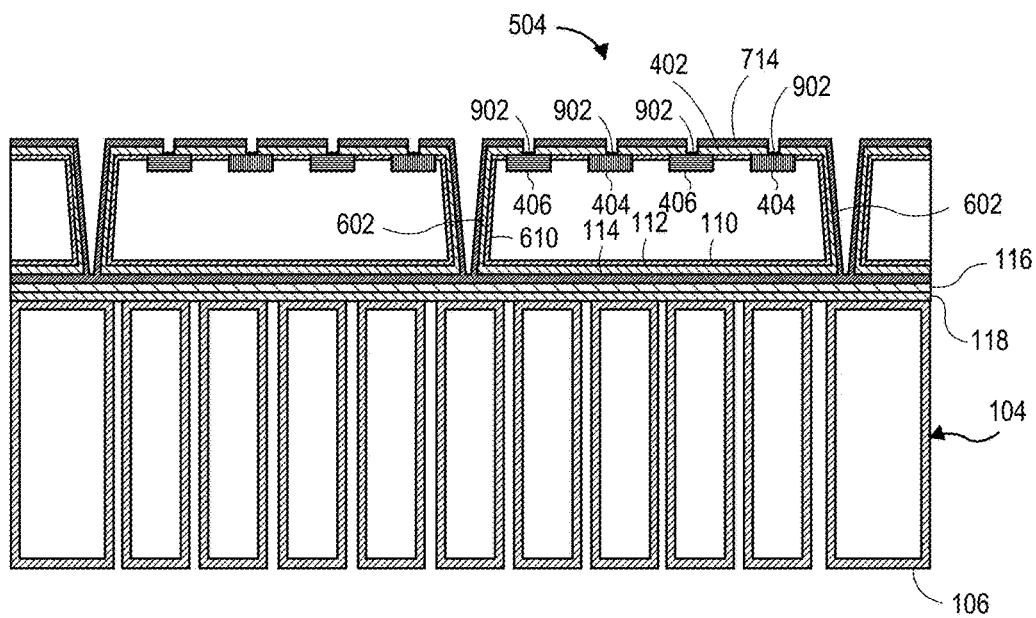
FIG. 9 schematically illustrates a cross-sectional view of one embodiment of contacts formed over implant regions within device cells.

Once contact holes 804 are formed, photoresist layer 802 may be removed using a conventional wet or dry etch process. Contacts 902, for example silicide contacts, are then formed in each of contact holes 804 as illustrated in FIG. 9. Contacts 902 may be formed using any conventional microfabrication processing technique suitable for forming silicide contacts, or other contacts that provide low contact resistance to the implanted regions.

Figure 10:
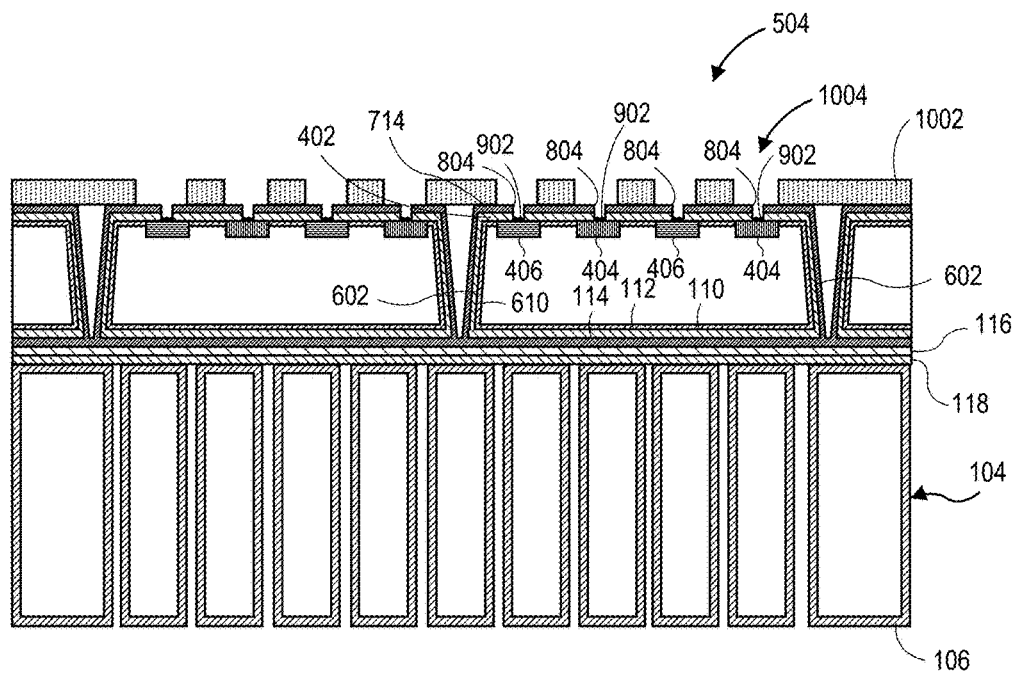
FIG. 10 schematically illustrates a cross-sectional view of one embodiment of a masking layer and pattern for forming reflective structures on device cells.

A further mask or photoresist layer 1002 is formed and patterned to define reflective structure holes 1004 as illustrated in FIG. 10. Reflective structure holes 1004 may be aligned with contact holes 804. In one embodiment, reflective structure holes 1004 may have a larger diameter than contact holes 804.

Figure 11:
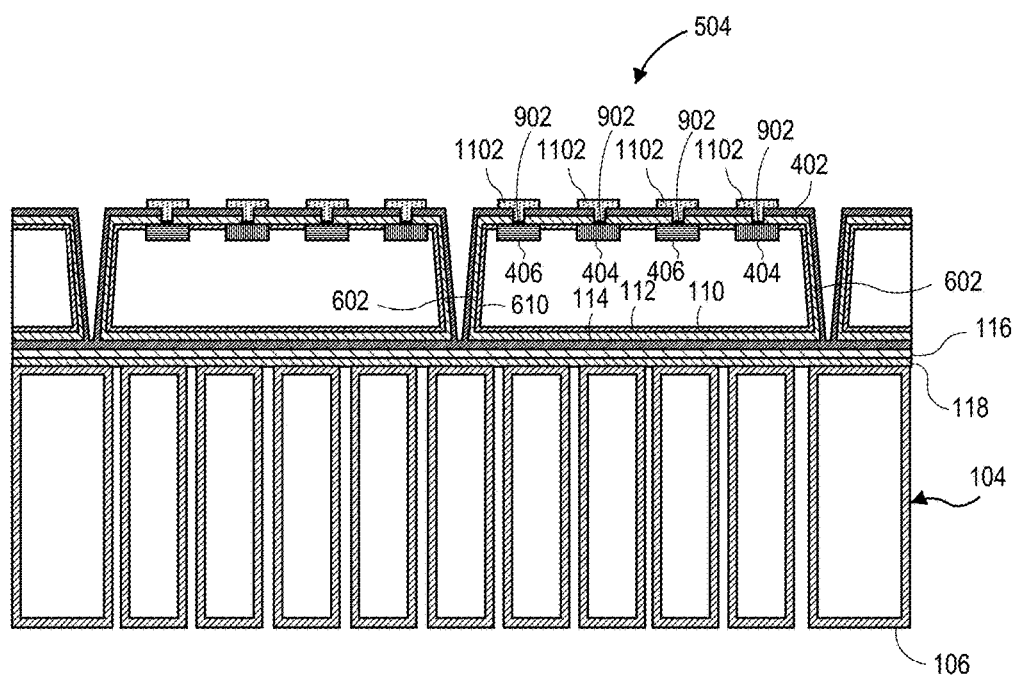
FIG. 11 schematically illustrates a cross-sectional view of one embodiment of reflective structures formed on device cells.

Reflective structures 1102 are then deposited within each of structure holes 1004 as illustrated in FIG. 11. Reflective structures 1102 may be, for example, metal deposits which form T-shaped structures along bottom side 124 of device cell 504. Representatively, reflective structures 1102 may be made by depositing a reflective material layer (e.g., metal) over photoresist layer 1002 so that the material fills holes 1004 and holes 804. Once reflective structures 1102 are formed, photoresist layer 1002 and any material remaining outside of holes 1004, 804 can be removed (e.g. metal lift-off). These reflective structures would also be used as a metallization layer to collect generated carriers (i.e., electrons) from the contacts to the doped regions and allow a method to make contacts to the larger power circuit connected to the solar cell.

The final device cell 504 may then be removed from handle wafer 104 by attaching a receiving substrate (not shown) to bottom side 124 of each device cell 504. The receiving substrate may be, for example, a temporary substrate that each device cell 504 can be attached to using an adhesive or a permanent substrate attached to device cell 504 using solder. Release layer 116 is then etched (e.g., $XeF_2$ applied) to release each device cell 504 from handle wafer 104. Each device cell 504 is then attached to the receiving substrate for further processing and/or removed for use in the desired application.

Figure 12:
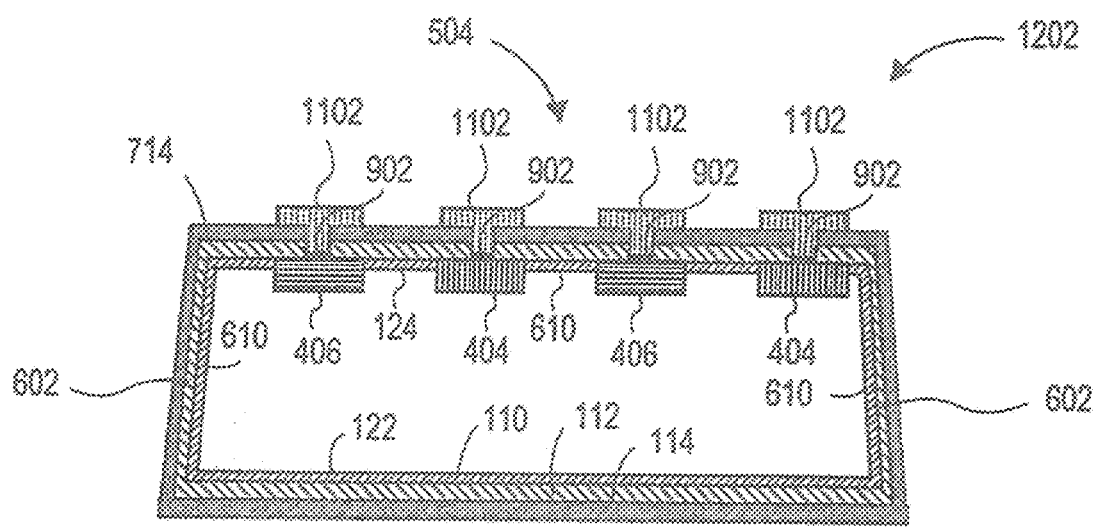
FIG. 12 schematically illustrates a cross-sectional view of one embodiment of a device cell.

FIG. 12 illustrates one embodiment of a final device cell 504 that has been removed from handle wafer 102 and any associated receiving substrate. In one embodiment, final device cell 504 can be a solar cell having reflective structures 1102 formed along bottom side 124. In addition, passivation layers 110, 610 and anti-reflective layers 114, 714 are formed around all sides of device cell 504. Reflective structures 1102 form a reflective layer 1202 along the bottom side 124 of device cell 504.

Each of the passivation layers 110, 610, anti-reflective layers 114, 714 and reflective structures 1102 help to improve efficiency and enhance photoelectronic functionality of device cells 504. In particular, reflective structures 1102 act as a reflective layer 1202 along the bottom side 124 of device cell 504. As photons enter device cell 504 through top side 122 toward the bottom side 124, they hit reflective layer 1202 which in turn reflects the photons internally within the cell. This causes the photons to remain within device cell 504 for a longer period of time and enhances overall photon absorption by device cell 504. In addition, since reflective layer 1202 can be metal, it allows for better process compatibility of device cell 504 with solders and/or epoxies.

Further enhancing optical properties of device cell 504 is the optical layer 120 (see FIGS. 1-3) formed along the top side 122. In particular, as photons enter through top side 122, optical layer 120, when formed as a diffraction layer, acts as a grating to diffract and disperse the photons throughout device cell 504. The diffracted photons are then reflected throughout device cell 504, for example by reflective structures 1102, thus resulting in multiple (total) internal reflection and absorption of photons that enter device cell 504.

Finally, the formation of passivation layers 110, 610, 124 around all sides of device cell 504, helps to improve cell efficiency by providing built-in electric field passivation and enabling carrier collection through doped regions across all sides of device cell 504. In addition, the formation of anti-reflective layers 114, 714 around all sides of device cell 504 helps to increase photon entry into device cell 504.

Device cell 504 may have an overall thickness (e.g. distance from the bottom side to the top side) of from about 1 µm to about 50 µm. Device cell 504 may have an overall width (e.g., distance between opposing sidewalls) of from about 50 µm to about 1 cm, for example, from 250 µm to 1 mm. Although specific dimensions are disclosed, it is contemplated that each device cell 504 may have an arbitrary size, shape and functionality. Representatively, one or more of device cells 504 can be detectors, sensors, photovoltaic (PV) cells, integrated circuits (ICs), micro-machine parts, micro-mechanical parts, electronic components, or any semiconductor devices. After the devices are released from the structured wafer, the devices can be separated from the receiving substrate and re-assembled for a specific configuration, without needing dicing or sawing of the parts.

In one embodiment, the final device cell includes a single reflective layer as illustrated in FIG. 12. In another embodiment, a second reflective layer can be applied to further enhance the optical properties of the device cell. A process for forming a device cell having a second reflective layer will now be discussed in reference to FIGS. 13-19.

Figure 13:
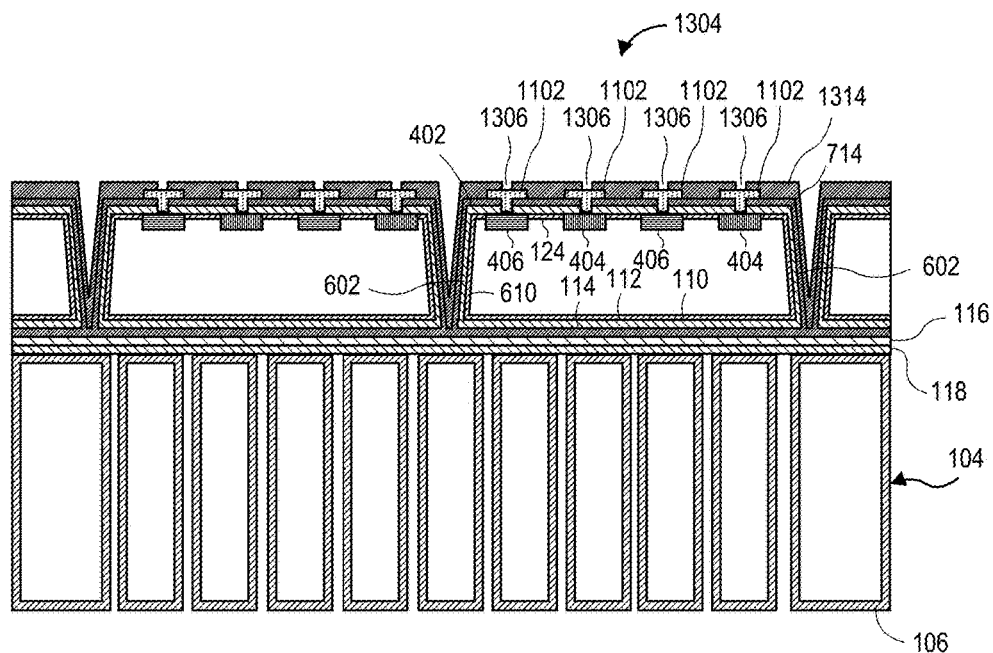
FIG. 13 schematically illustrates a cross-sectional view of another embodiment of a device cell including a first and second anti-reflective layer.

FIG. 13 illustrates device cell 1304 having a second dielectric layer 1314 formed over the previously formed anti-reflective layer 714 and reflective structures 1102. Device cell 1304 is substantially the same as device cell 504 except that it includes an additional dielectric layer 1314 that may be used in conjunction with layer 714 as an anti-reflection layer (for a bifacial cell arrangement). Dielectric layer 1314 may be formed, and made of a material, similar to anti-reflective layer 714. Representatively, in one embodiment, anti-reflective layer 1314 is made of a nitride material that is deposited to form a nitride layer having a thickness of from about 0.05 µm to about 0.3 µm. Layer 1314 provide electrical isolation between the metal forming reflective structures 1102 and the metal that will be used to form the second reflective layer.

Vias 1306 may be formed through dielectric layer 1314 and over each of reflective structures 1102. Vias 1306 may be formed, for example, by forming a mask layer (e.g., a photoresist layer) over dielectric layer 1314 and patterning the mask layer to include openings that are aligned with reflective structures 1102. An etch method can then be applied over the mask layer to form vias 1306. Vias 1306 are used to create selected electrical pathways through dielectric layer 1314 between reflective structures 1102 and the second reflective layer that will be formed.

Figure 14:
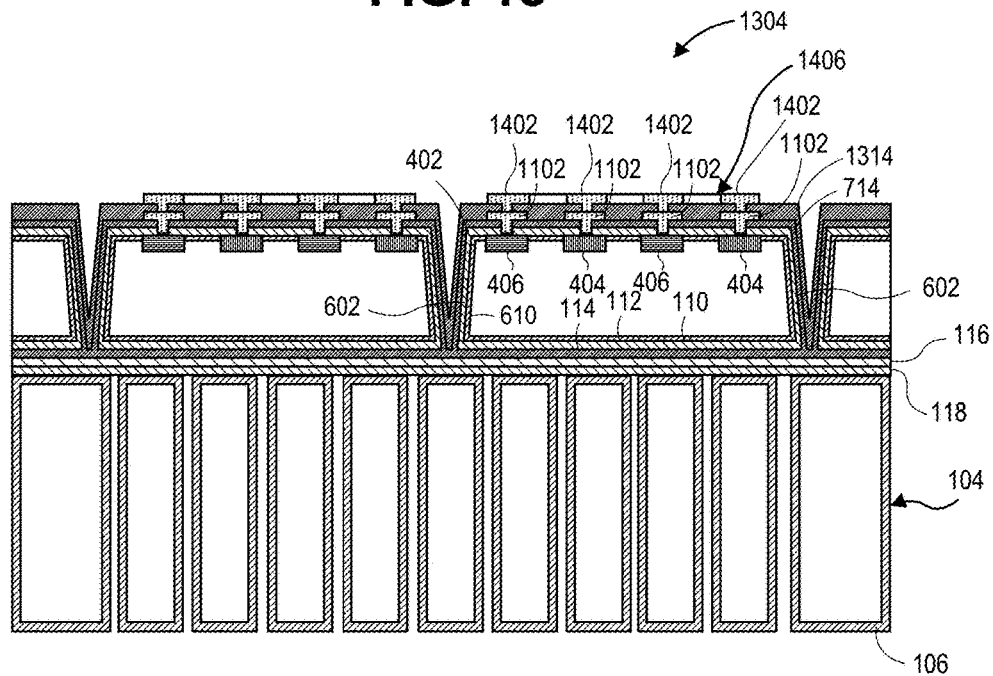
FIG. 14 schematically illustrates a cross-sectional view of another embodiment of a device cell including first and second reflective structures.
Figure 15:
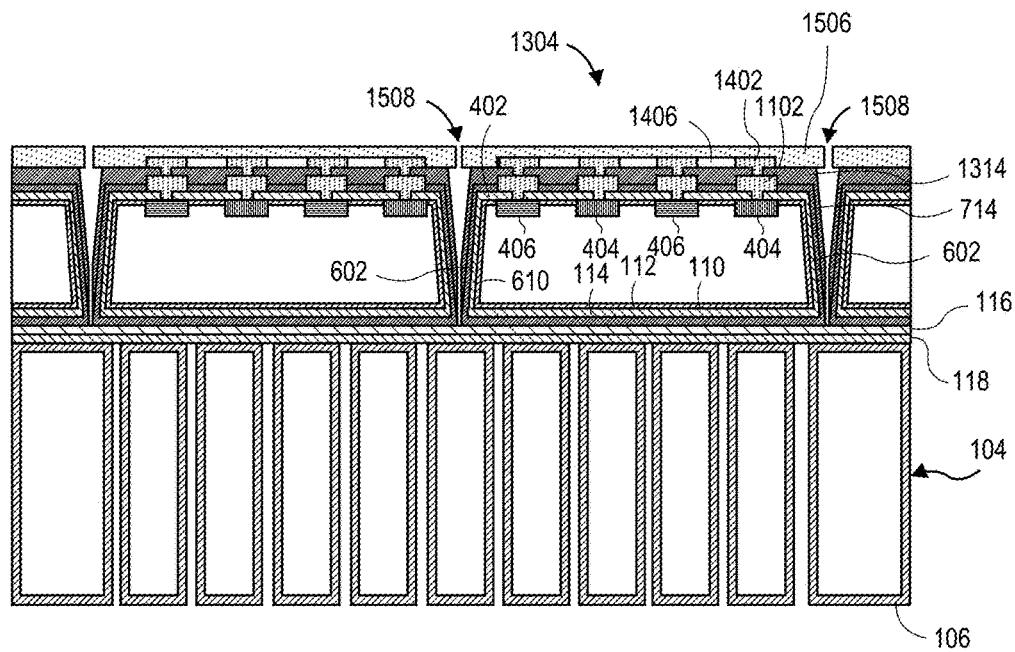
FIG. 15 schematically illustrates a cross-sectional view of another embodiment of a device cell separated from an adjacent device cell.

A further mask or photoresist layer 1406 (e.g., dry film resist) can be formed and patterned to form reflective structures 1402 as illustrated in FIG. 14. More specifically, similar to openings 1004 formed in reference to FIG. 10, photoresist layer 1406 is patterned to form openings over each of vias 1306. The openings and vias 1306 may be filled with a reflective material, as previously discussed in reference to FIG. 10 using a metal lift-off approach, to form reflective structures 1402. Alternatively, an electroplating approach can be used to deposit the reflective material in the openings defined above vias 1306 which would then allow the resist or mask material to be left in place (as shown in FIG. 14). Reflective structures 1402 may be, for example, metal deposits which form T-shaped structures along bottom side 124 of device cell 1304. Reflective structures 1402 may be formed similar to reflective structures 1102. Reflective structures 1402 may be made of any material having reflective properties (e.g., metal). In this aspect, reflective structures 1402 may be made of the same or different material as reflective structures 1402. In many embodiments, the reflective structures will also be used as electrically conductive structures for collecting the excited carriers (i.e., electrons) generated in the PV cell.

Once reflective structures 1402 are formed, another mask or photoresist layer 1506 (e.g., dry film resist) is formed over each device cell 1304. Photoresist layer 1506 is patterned to include openings 1508 between each device cell 1304. An etchant is then applied between openings 1508. The etchant (e.g., trifluoromethane) etches through portions of anti-reflective/dielectric layers 714, 1314 between each device cell 1304 to separate the cells. It is noted, however, that this step is optional therefore in some embodiments photoresist layer 1506 may be omitted.

Figure 16:
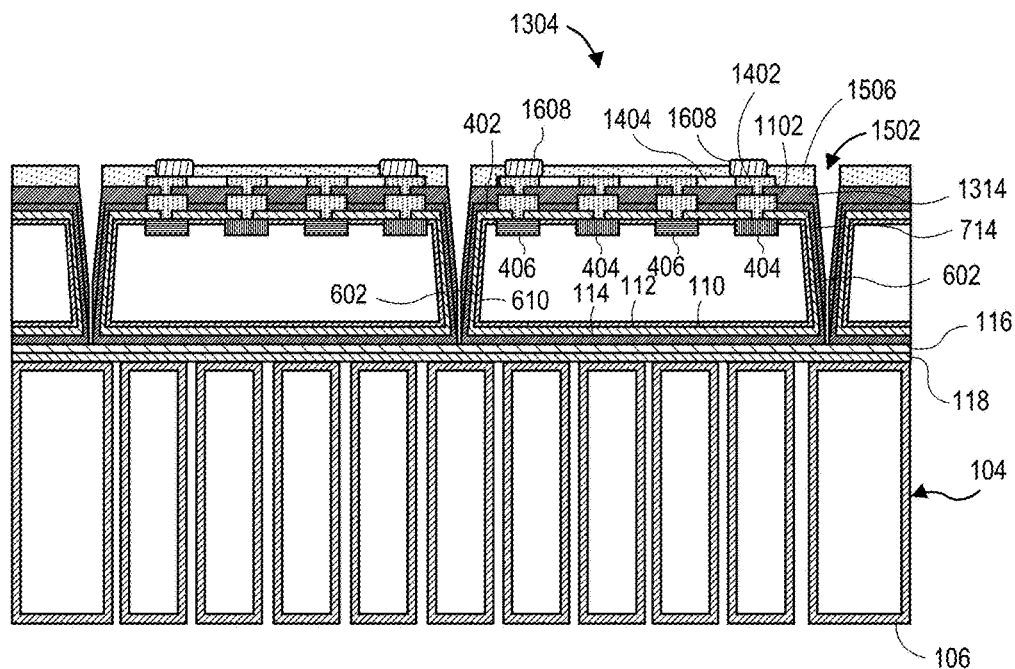
FIG. 16 schematically illustrates a cross-sectional view of another embodiment of a device cell having contacts formed over reflective structures.

Once each device cell 1304 is separated from another, portions of photoresist layer 1506 overlapping trenches 502 can be removed as illustrated in FIG. 16. In addition, contacts 1608 can be formed over reflective structures 1102, 1402. A further mask or photoresist layer (not shown) can be formed over photoresist layer 1506 and patterned to form contacts 1608 and remove overlapping portions of photoresist layer 1506. Representatively, the photoresist layer may be patterned to have openings over trenches 1502 and one or more of reflective structures 1102, 1402. The overlapping portions may be removed by applying an etchant, solvent, or developer capable of removing portions of photoresist layer 1506.

To form contacts 1608, a conductive material such as an epoxy or solder may be applied over the photoresist layer such that it fills the openings over trenches 1502. In some embodiments, contacts 1608 are formed using a screen printing technique. Contacts 1608 are the final metal interconnect between the power generated at the cell level and the power circuit that ties many cells together with the loads that the generated power is used to drive. Overall, the semiconductor material generates the energetic electrons resulting from the photons coming into the cell. The silicide contacts 902 allow a pathway for the excited electrons to pass from the semiconductor cell material to the metal reflective structures 1102, 1402. Finally, the contacts 1608 allow the electrons to pass from the reflective structures to the larger power circuit beyond the cell. Although not illustrated, similar contacts may be formed over reflective structures 1102 described in reference to FIG. 12.

Figure 17:
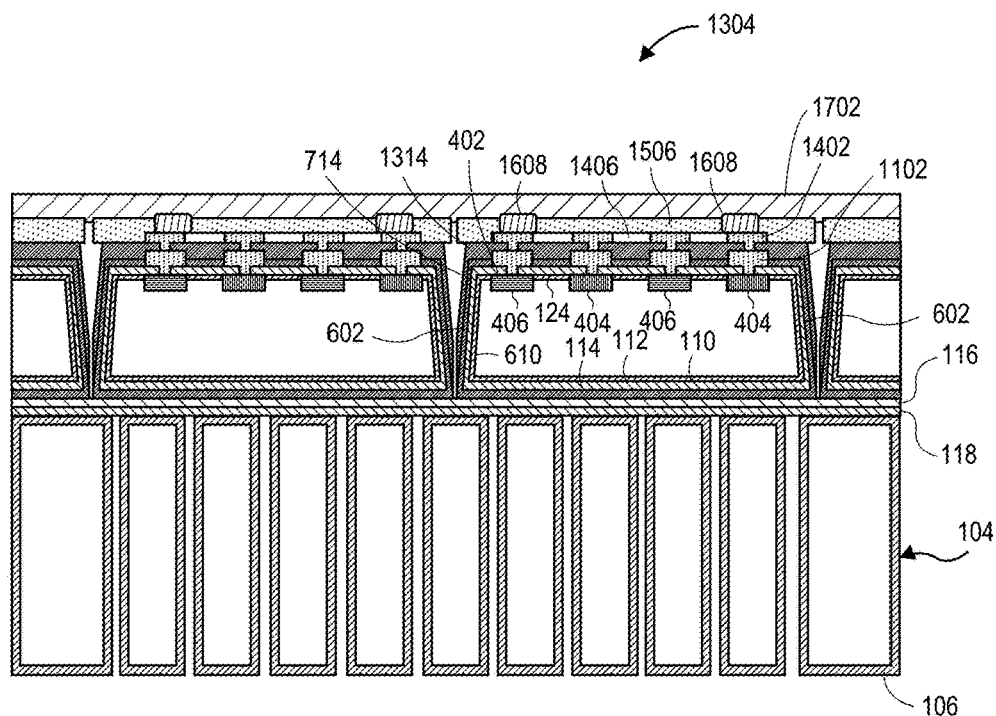
FIG. 17 schematically illustrates a cross-sectional view of another embodiment of a device cell attached to a receiving substrate.
Figure 18:
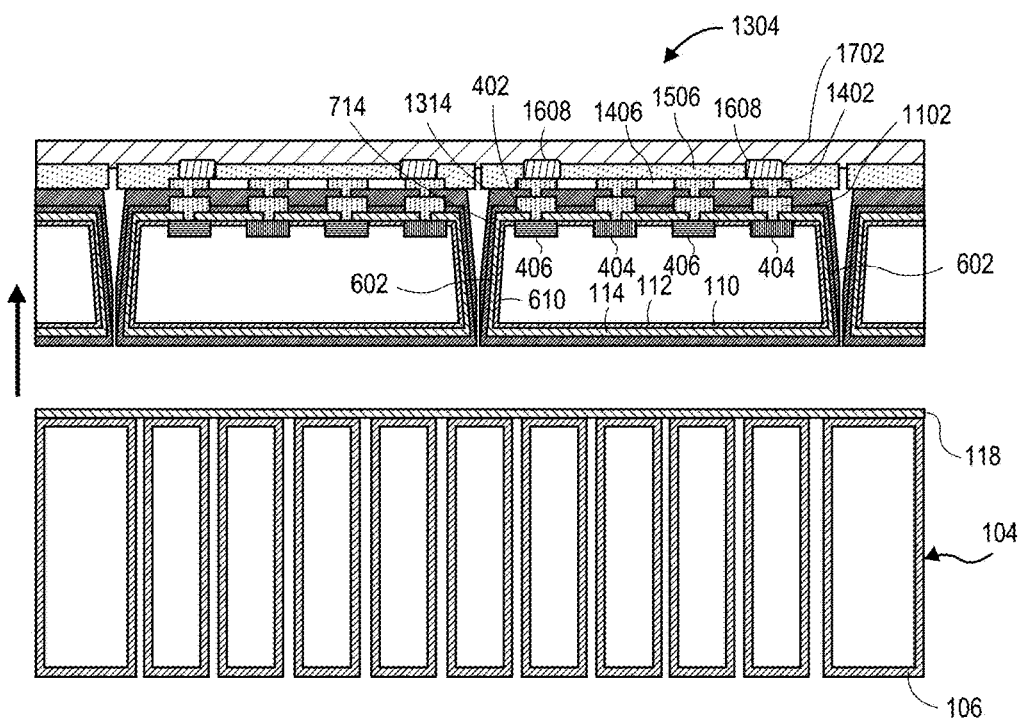
FIG. 18 schematically illustrates a cross-sectional view of another embodiment of a device cell being removed from the handle wafer while still attached to a receiving substrate.

Once device cells 1304 are formed, a receiving substrate 1702 may be attached to bottom side 124 of each device cell 1304 as illustrated in FIG. 17. Receiving substrate 1702 may be, for example, a temporary substrate that each device cell 1304 can be attached to using an adhesive or a permanent substrate attached to device cell 1304 using solder. Release layer 116 is then etched (e.g., XeF$_2$ applied) to release each device cell 1304 from handle wafer 104 as illustrated in FIG. 18. Each device cell 1304 can then be removed from receiving substrate 1702 or remain attached to receiving substrate 1702 depending on the desired use.

Figure 19:
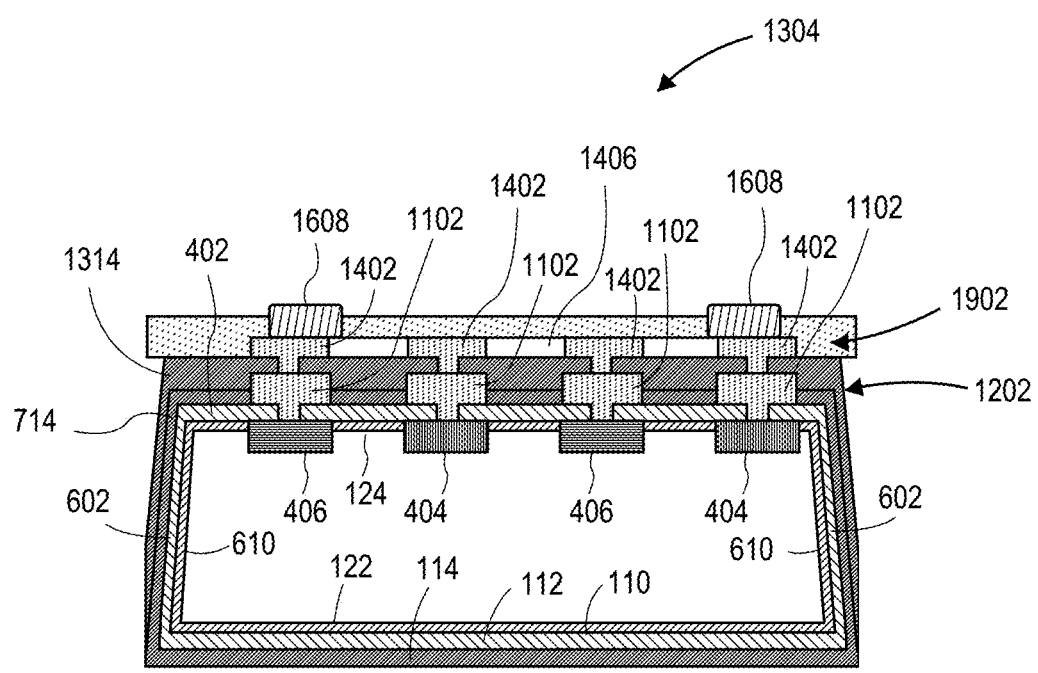
FIG. 19 schematically illustrates a cross-sectional view of another embodiment of a device cell.

FIG. 19 illustrates one embodiment of a final device cell 1304 which has been removed from any associated receiving substrate. In one embodiment, final device cell 1304 can be a solar cell having a first reflective layer 1202 formed by reflective structures 1102 and a second reflective layer 1902 formed over the first reflective layer 1202 by reflective structures 1402. In addition, passivation layers 110, 610 and anti-reflective/dielectric layers 114, 714, 1314 are formed around all sides of device cell 1304. Device cell 1304 further includes the optical layer 120 (see FIGS. 1-3) formed along the top side 122. Device cell 1304 therefore may have similar enhanced optical efficiency as previously discussed in reference to FIG. 12.

Similar to device cell 504, device cell 1304 may have an overall thickness (e.g., distance from the bottom side to the top side) of from about 1 μm to about 50 μm. Device cell 1304 may have an overall width (e.g., distance between opposing sidewalls) of from about 50 μm to about 1 cm, for example, from 250 μm to 1 mm. Although specific dimensions are disclosed, it is contemplated that each device cell 1304 may have an arbitrary size, shape and functionality. Representatively, one or more of device cells 1304 can be detectors, sensors, photovoltaic (PV) cells, integrated circuits (ICs), micro-machine parts, micro-mechanical parts, electronic components, or any semiconductor devices. After the devices are released from the structured wafer, the devices can be separated from the receiving substrate and re-assembled for a specific configuration, without needing dicing or sawing of the parts.

While certain embodiments have been described and shown in the accompanying drawings, it is to be understood that such embodiments are merely illustrative of and not restrictive on the broad invention, and that the invention is not limited to the specific constructions and arrangements shown and described, since various other modifications may occur to those of ordinary skill in the art. The description is thus to be regarded as illustrative instead of limiting.

What is claimed is:

1. A method of manufacturing solar cells comprising:
    forming, on a top side of a device layer, an optical layer having surface modifications effective for changing a propagation angle of light incident on the device layer;
    after forming the optical layer, releasably bonding the device layer to a release layer formed on an exposed surface of a handle wafer such that the optical layer is facing the handle wafer;
    adding n-type and p-type dopants to the device layer so as to form n-type and p-type regions in a bottom side of the device layer while the device layer is bonded to the handle wafer;
    forming trenches within the device layer by etching, so as to define a plurality of individual device cells separated from each other by sidewalls extending between the top side and the bottom side of the device layer while the device layer is bonded to the handle wafer;
    applying a dopant to the bottom side and sidewalls of each of the individual device cells to form a lightly doped surface field passivation layer around each of the individual device cells while the device layer is bonded to the handle wafer;
    forming an anti-reflective layer over the lightly doped surface field passivation layer of each of the individual device cells while the device layer is bonded to the handle wafer;
    forming, on the bottom side of each of the individual device cells, a reflective layer effective for reflecting the incident light internally within the device cells while the device layer is bonded to the handle wafer; and
    after the adding n-type and p-type dopants, the forming trenches, the applying a dopant, the forming an anti-reflective layer, and the forming a reflective layer, separating the individual device cells from the handle wafer by removing the release layer from the handle wafer.

2. The method of claim 1, wherein the surface modifications comprise a diffraction grating, and the step of forming an optical layer comprises:
    forming a diffraction grating having channels within the top side of the device layer; and
    filling the channels with a dielectric.

3. The method of claim 1, wherein prior to releasably bonding the device layer to the handle wafer, a top-side passivation layer and a top-side anti-reflective layer are formed over the top side of the device layer.

4. The method of claim 1, wherein the reflective layer is a first reflective layer, and the method further comprises forming a second reflective layer over the first reflective layer.

5. The method of claim 1, further comprising, prior to forming the reflective layer, forming a screen oxide layer over the bottom side of each of the device cells.

6. The method of claim 1, wherein the step of forming the reflective layer comprises:
    etching openings through the anti-reflective layer; and
    depositing a reflective material into the openings.

7. The method of claim 1, wherein the device layer is 50 μm or less in thickness.

8. The method of claim 1, wherein the anti-reflective layer is formed from silicon nitride.

9. A solar cell device fabrication method comprising the steps of:
    forming, on a top side of a device layer, a top side surface field passivation layer by lightly doping the top side of the device layer with a first-type dopant;
    after forming the top side surface field passivation layer, releasably bonding the device layer to a handle wafer such that the top side surface field passivation layer is facing the handle wafer;
    forming trenches within the device layer so as to define a plurality of individual device cells separated from each other by sidewalls extending between the top side and a bottom side of the device layer while the device layer is bonded to the handle wafer;
    forming a bottom side surface field passivation layer around each of the individual device cells by lightly doping the bottom side and sidewalls of each of the individual device cells with the first-type dopant while the device layer is bonded to the handle wafer; and
    after the step of forming a bottom side surface field passivation layer, separating the individual device cells from the handle wafer.

10. The method of claim 9, wherein prior to the step of releasably bonding the device layer to the handle wafer, a top side anti-reflective layer is formed over the top side of the device layer.

11. The method of claim 9, wherein the device layer is 50 µm or less in thickness.

12. The method of claim 9, further comprising the steps of:
- forming, on the top side of the device layer, an optical layer having surface modifications effective for changing a propagation angle of light incident on the device layer;
- adding n-type and p-type dopants to the device layer so as to form n-type and p-type regions in the bottom side of the device layer while the device layer is bonded to the handle wafer;
- forming an anti-reflective layer over the bottom side surface field passivation layer of each of the individual device cells while the device layer is bonded to the handle wafer; and
- forming, over the anti-reflective layer, a reflective layer effective for reflecting the incident light internally within the device cells while the device layer is bonded to the handle wafer.

13. The method of claim 12,
- wherein the surface modifications comprise a diffraction grating, and
- wherein the step of forming an optical layer comprises the steps of:
- forming a diffraction grating having channels within the top side of the device layer; and
- filling the channels with a dielectric.

14. The method of claim 12, wherein the reflective layer is a first reflective layer, and the method further comprises a step of forming a second reflective layer over the first reflective layer.

15. The method of claim 12, further comprising, prior to the step of forming a reflective layer, a step of forming a screen oxide layer over the bottom side of each of the device cells.

16. The method of claim 12, wherein the step of forming a reflective layer comprises the steps of:
- etching openings through the anti-reflective layer; and
- depositing a reflective material into the openings.

17. The method of claim 12, wherein the anti-reflective layer is formed from silicon nitride.

\* \* \* \* \*